United States Patent [19]

Takatsu

[11] Patent Number: 4,626,915
[45] Date of Patent: Dec. 2, 1986

[54] MOS SOLID-STATE IMAGE PICKUP DEVICE HAVING VERTICAL OVERFLOW DRAINS

[75] Inventor: Norihiko Takatsu, Tokyo, Japan

[73] Assignee: Nippon Kogaku K.K., Tokyo, Japan

[21] Appl. No.: 629,321

[22] Filed: Jul. 10, 1984

[30] Foreign Application Priority Data

Jul. 15, 1983 [JP] Japan .................... 58-127577

[51] Int. Cl.⁴ .............................................. H04N 3/14
[52] U.S. Cl. ................................... 358/213; 357/24
[58] Field of Search ........................ 358/213, 212; 357/24 LR, 30

[56] References Cited

U.S. PATENT DOCUMENTS 4,373,167 2/1983 Yamada .................... 357/30
4,450,464 5/1984 Yamada .................... 357/30

Primary Examiner—Gene Z. Rubinson
Assistant Examiner—Stephen Brinich
Attorney, Agent, or Firm—Michael N. Meller

[57] ABSTRACT

A MOS solid-state image pickup device having vertical overflow drains is capable of increasing the dynamic range for the brightness of a scene to be picked up. An electronic still picture camera is constructed by the image pickup device in combination with shutter means capable of simultaneously controlling the exposure of the whole area of the image pickup surface of the image pickup device and control means for varying the potential at the potential well of the image pickup device during the exposure time and thereby providing an increased dynamic range characteristic for a picture output signal.

7 Claims, 13 Drawing Figures ial level higher than the first potential level and lower than the second potential level; and the MOS solid-state image pickup device further including means for shifting the potential levels of the first and fourth regions in such a manner that the potential level of the first region is maintained lower than the potential level of the fourth region and the potential level of the fourth region is higher than the potential level of the second region.

MOS SOLID-STATE IMAGE PICKUP DEVICE HAVING VERTICAL OVERFLOW DRAINS

BACKGROUND OF THE INVENTION

1. Field of the Invention

The present invention relates to a MOS solid-state image pickup device provided with vertical overflow drains More particularly, the invention relates to an external shutter-equipped electronic still picture camera capable of increasing the dynamic range with respect to the brightness of a scene to be picked up.

2. Description of the Prior Art

Generally, each of the photodiodes arranged in a photo-detecting section of a solid-state image pickup device generates charges in an amount proportional to the intensity of light and there is a limitation with respect to the amount of charge which can be stored in the photodiode. Therefore, if the brightness of the scene to be picked up is high, the stored charges of the photodiode are saturated in a short period of time. In view of this fact, Japanese Laid-Open Patent Application No. 58-6682, Jan. 14, 1983, discloses an IT-CCD (interline transfer-charge coupled device) which provides a solid-state image pickup device with a characteristic designed to vary the storage capacity for charges generated from the photodiodes with time and thereby increase the dynamic range of the image pickup device for the brightness of the scene to be picked up.

In Japanese Laid-Open Patent Application No. 58-6682, the read-out gate units are controlled so that during the period of exposure to light, the potential of each read-out gate unit (which may also be called a transfer gate) for transferring the charges from the photodetector to each vertical transfer unit has at least two different levels, thereby allowing the charges from the photodetector to flow to the vertical transfer unit through the read-out gate unit. However, the charges transferred to the vertical transfer units must be delivered to the outside by a driving operation of applying pulses to the vertical transfer units and a horizontal transfer unit and corresponding to at least one field. Also, where the charges in the vertical transfer units are transferred in the opposite direction, means must be additionally provided to deliver the transferred charges to the outside.

SUMMARY OF THE INVENTION

In a camera including a MOS solid-state image pickup device and a shutter for generating a picture signal by the image pickup device, it is an object of the present invention to increase the dynamic range for the brightness of the scene to be picked up.

In accordance with the present invention there is thus provided a MOS solid-state image pickup device for detecting a light intensity distribution on a given surface including: a first region of n-type semiconductor extended in a direction along the given surface to generate charges corresponding to the light intensities; a second region of p-type semiconductor arranged along the given surface to adjoin the first region; a third region of n-type semiconductor arranged along the given surface to adjoin the second region; and a fourth region of p-type semi-conductor arranged in a direction substantially perpendicular to a direction in which the given surface extends to adjoin the first region, the first region having a first potential level with respect to the charges, the second region having a second potential level higher than the first potential level, the third region having a third potential level lower than the second potential level, the fourth region having a fourth poten-

DETAILED DESCRIPTION OF THE PREFERRED EMBODIMENTS

Figure 1:
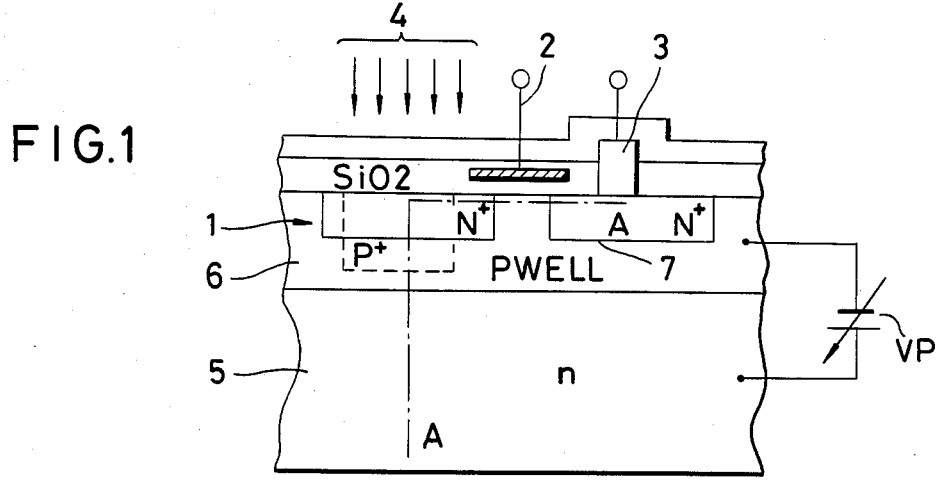
FIG. 1 is a sectional view showing the construction of a principal part of an example of a MOS solid-state image pickup device according to the invention.

FIG. 1 is a sectional view showing the construction of a principal part of an embodiment of a MOS solid-state image pickup device used with the invention. FIG. 1 illustrates a sectional view of the device cut through a plane crossing a photodetector 1, a vertical transfer gate 2 and a vertical signal line 3 and a p-type semiconductor PWELL 6 is formed on a substrate 5 consisting of n-type semiconductor substrate. The PWELL 6 includes the photodetector 1 composed of an N+ region higher in purity than the substrate 5 and a P+ region higher in purity than the PWELL 6 and an n-type semiconductor N+7 for transferring the charges generated in the photodetector 1 to the vertical signal line 3 by the application of a voltage to the vertical transfer gate 2.

A light beam 4 projected on the photodetector 1 is converted to negative charges and the charges are stored in the junction between the N+ and P+ regions and the junction between the N+ region and the PWELL 6. The vertical transfer gate 2 serves the function of transferring the signal charges stored in the photodetector 1 to the vertical signal line 3. Using the vertical transistor formed by the N+ region of the photodetector 1, the PWELL 6 and the n-type substrate 5, the MOS solid-state image pickup device drains the charges overflowing from the photodetector 1 to the substrate 5 through the PWELL 6 and this structure is referred to as a vertical overflow drain structure. In addition, a variable voltage VP is applied across the PWELL 6 and the substrate 5. The charges stored in the photodetector 1 are transferred to the vertical signal line 3 by a voltage applied to the vertical transfer gate 2 from a vertical shift register in response to a pulse $\phi V$ which will be described later and the charges are then read out by a horizontal shift register in response to a pulse $\phi H$ which will be described later.

Figure 2:
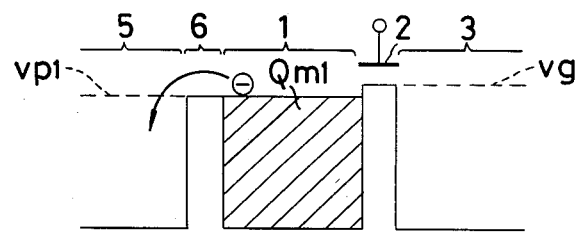
FIGS. 2, 3 and 4 are views corresponding to the section taken along the line A—A of FIG. 1 showing different potential conditions.

FIG. 2 is a view corresponding to the section taken along the line A—A of FIG. 1 and showing the potential conditions at various points. Also, FIGS. 3 and 4 are views showing the potential conditions just after varying the voltage VP applied across the PWELL 6 and the substrate 5.

In FIG. 2, the PWELL 6 has a potential vp1 which is slightly lower than a potential vg under the vertical transfer gate 2 and Qm1 represents the maximum amount of signal charge which can be stored in the photodetector 1 (which comprises a photodiode in this case).

Figures 3, 4:
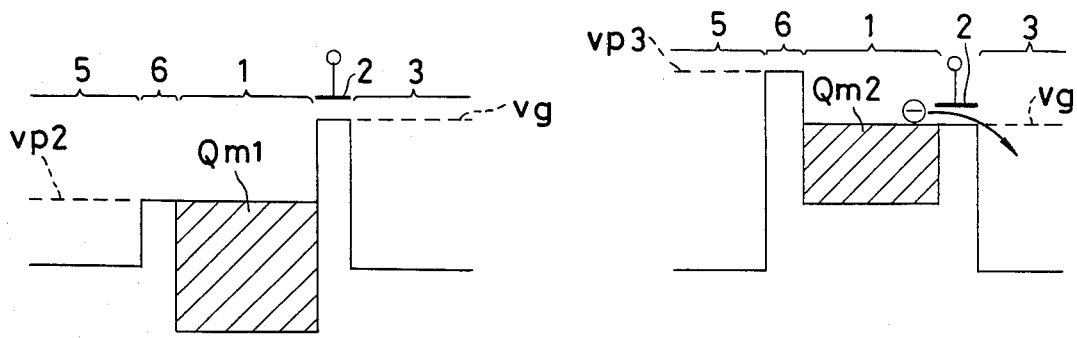

Then, if the potential vp1 of the PWELL 6 is changed to vp2 (vp1>vp2) as shown in FIG. 3, since the photodiode is formed on the PWELL 6, the potentials of the PWELL 6 and the photodiode 1 vary by substantially the same amount so that the maximum amount of storable signal charge remains Qm1 and the charges do not flow to the n-type substrate 5 but remain in the photodetector 1.

On the contrary, if the potential vp1 of the PWELL 6 is changed to vp3 (vp1<vp3) as shown in FIG. 4, the signal charges remaining in the photodetector 1 flow toward the vertical transfer signal line 3 through the vertical gate 2. In this case, the extraneous charges dumped on the vertical signal line 3 can, for example, be taken to the outside at the time of the scanning of the first line during the reading and this occurs during the vertical blanking period, thus causing no detrimental effect on a picture.

Under the conditions as shown in FIG. 4, the maximum amount of signal charge storable in photodetector 1 becomes Qm2 (Qm1>Qm2).

In other words, in the MOS solid-state image pickup device, by controlling the voltage VP applied to the PWELL 6 in such a manner that the potentials of the PWELL 6 and the photodetector 1 are changed from the conditions shown in FIG. 4 to the conditions shown in FIG. 2 during the exposure time, it is possible to vary the amount of change of the storable signal charge.

The fact that the maximum amount of charge storable in the photodetector 1 is varied with time by varying the voltage VP will now be described with reference to FIG. 6. Assume now that VP1 represents the value of the voltage VP in FIG. 2 and VP3 represents the value of the voltage VP in FIG. 4.

Figure 6:
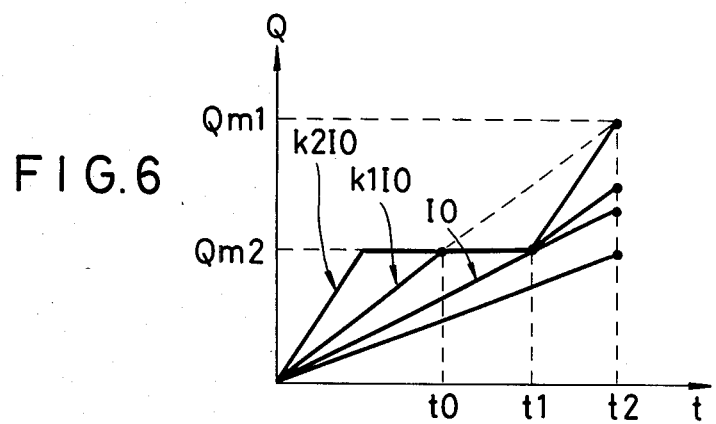
FIGS. 6 and 7 are graphs useful for explaining dynamic range characteristics for the brightnesses of the scene to be picked up.

FIG. 6 is a graph showing the relation between the amount of charge Q stored in the photodetector in response to a light having an intensity I and the time t up to an exposure time t2. In FIG. 6 there is a proportional relation between the light intensity and the generation of signal charges and therefore the slope of the straight line is proportional to the light intensity. Assume now that $I_o$ ($I_o$=Qm2/t1) represents that light intensity which generates the amount of signal charge Qm2 at a time t1. In the case of light of intensity lower than the light intensity $I_o$, variation of the voltage VP with time has no effect on the amount of signal charge and the amount of signal charge increases linearly as shown in FIG. 6. Next, consider a case where the light intensity I is k1.$I_o$. Here, it is assumed that k1 is given as follows.

k1=t1/t0

1<k1<(Qm1−Qm2)/(t2−t1)

With this light intensity, the first potential well is saturated at a time t0 before reaching the time t1. However, when the time t1 is reached, the potential well is increased and the amount of signal charge again begins to increase toward Qm1. Next, consider a case where the light intensity is k2.$I_o$, where k2=(Qm1−Qm2)/(t2−t1). With this light intensity, the first potential well is saturated still earlier or before reaching the time t0. However, when the time t1 is reached, the potential well is increased so that the amount of signal charge again start to increase and the potential well is saturated again at the time t2. In other words, while the amount of signal charge does not attain Qm1 during the interval from t1 to t2 with the light intensity I≦k2.$I_o$, the potential well is saturated during the interval with the light intensity I>k2.$I_o$.

Figure 7:
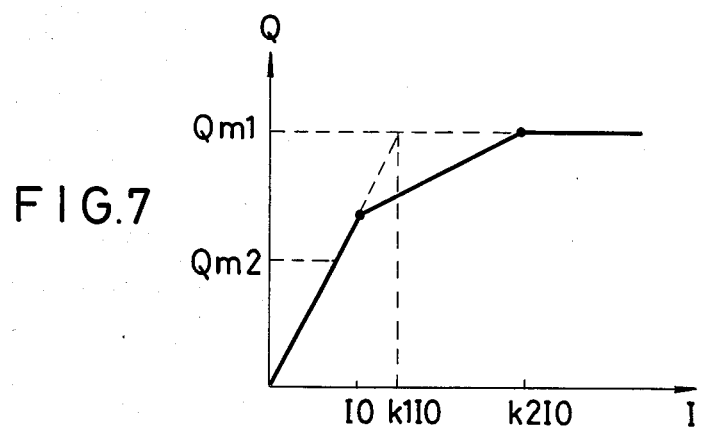

FIG. 7 is a graph in which the ordinate represents the amount of signal charge and the abscissa represents the light intensity. As will be seen from FIG. 7, while the saturation occurs with I=k1.$I_o$ if the voltage VP=VPI is used and the potential well is increased throughout the interval between the beginning of exposure and the exposure time t2, varying the voltage with time has the effect of preventing the saturation until I=k2.$I_o$ and thereby providing a characteristic which increases the dynamic range for light intensities.

Figure 5:
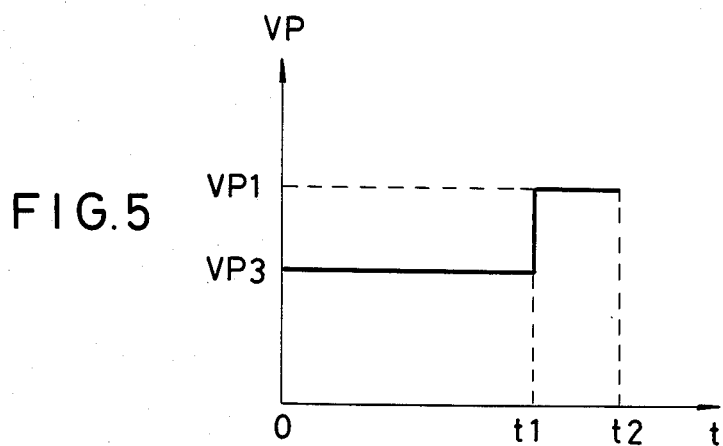
FIG. 5 is a graph showing the relation between the potential VP and the exposure time.

With the MOS solid-state image pickup device used with the electronic still picture camera according to the invention, the voltage VP applied to the PWELL 6 is varied as shown in FIG. 5 during the interval from the beginning of exposure up to the time t2, thereby attaining the relation between the amount of charge and the light intensity as shown by the characteristic of FIG. 7.

Considering now the voltages VP1 and VP3 applied to the PWELL 6 shown in FIG. 5, it will be seen that in the the voltage VP3 is applied to the PWELL 6 until the time t1, thus using the charge quantity of Qm2 for the ordinary light signal charges, and that the voltage VP1 is applied to the PWELL 6 during the interval between the time t1 and t2, thus using the charge quantity of (Qm1−Qm2) with respect to the signal charges for the high brightness object portions.

As a result, to increase the PWELL voltage VP3 increases the amount of signal charge for the ordinary light, thereby decreasing the signal component corresponding to the high intensity light, and to decrease the voltage VP3 has the effect of decreasing the amount of charge for the ordinary light, thereby emphasizing the signal for the high intensity light.

Also, in FIG. 5, the time interval from t0 to t1 is the ordinary light exposure time and the time interval from t1 to t2 is the high intensity light exposure time. Thus, by reducing the interval from t1 to t2, it is possible to obtain more high intensity light information and increase the dynamic range further.

The electronic still picture camera according to the invention includes a mechanism for controlling the PWELL voltage VP3 of the MOS solid-state image pickup device and a mechanism for varying the exposure time t1, thereby affording increased freedom to a photographer.

Figure 8:
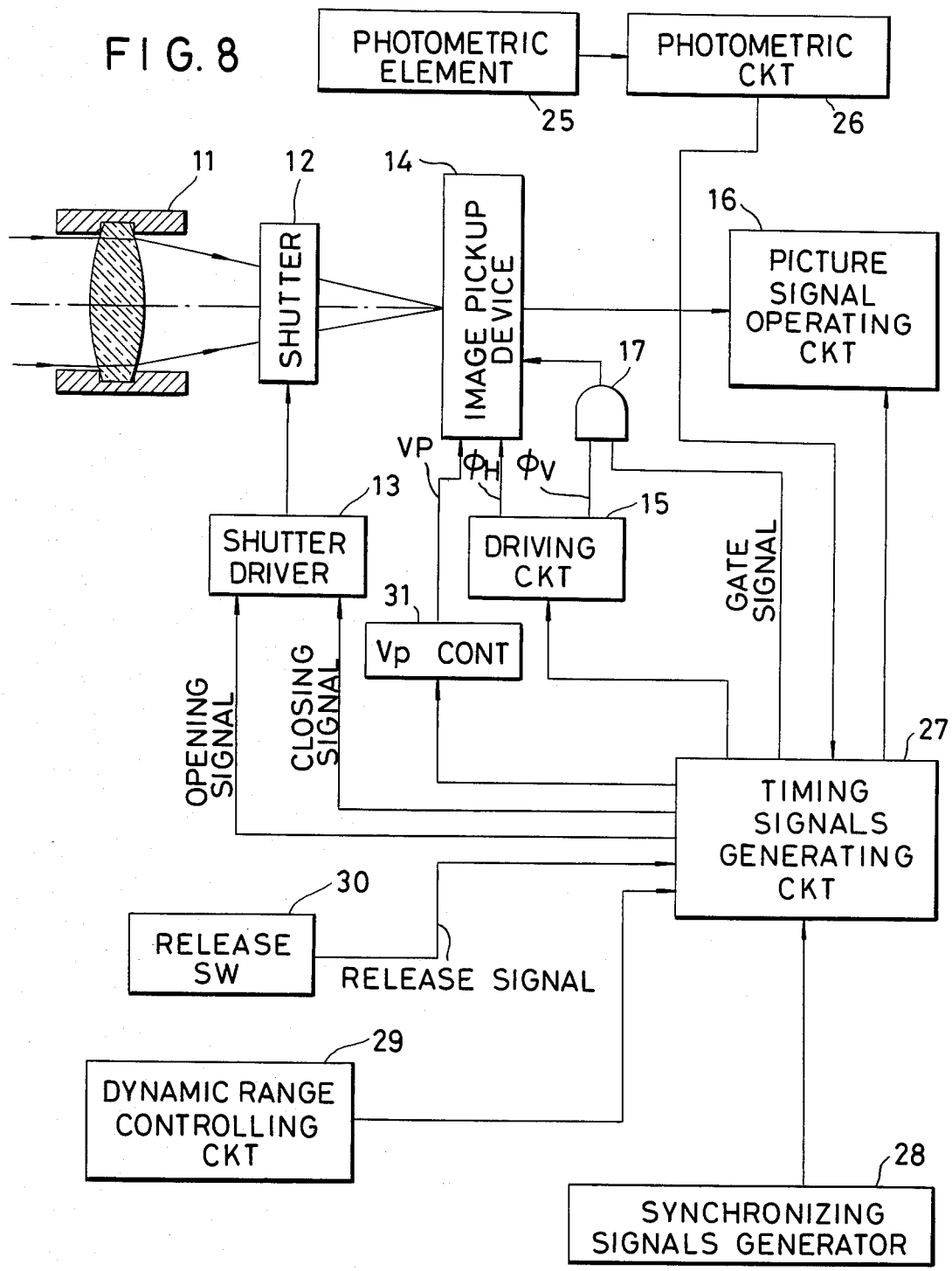
FIG. 8 is a block diagram showing the overall construction of an electronic still picture camera according to the invention.
Figure 9:
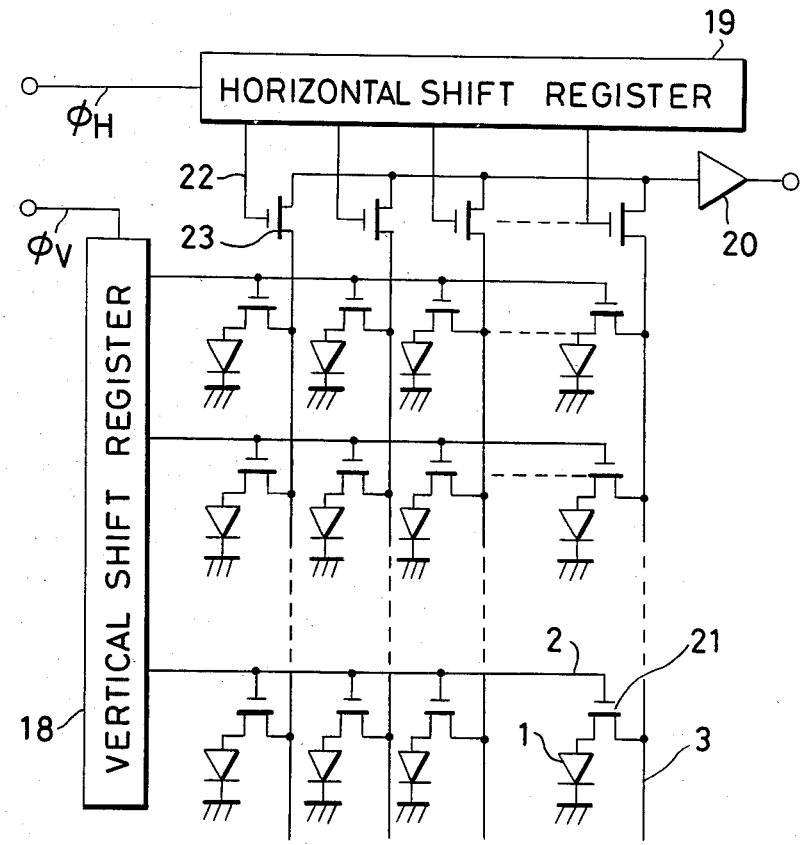
FIG. 9 is an electric circuit diagram of a MOS solid-state image pickup device.

FIG. 8 illustrates a block diagram for the electronic still picture camera according to the invention. FIG. 9 is a diagram showing the MOS solid-state image device in the form of an electric circuit. Referring first to FIG. 8, a shutter 12 controls the amount of exposure light passing to the photosensitive surface of a MOS solid-state image pickup device 14 arranged at the focal plane of a phototaking lens 11. A shutter driver 13 for opening and closing the shutter 12 is controlled by a timing signals generating circuit 27 for generating timing signals in accordance with a photometric output from a photometric circuit 26 which generates the photometric output corresponding to the light intensity detected by a photometric element 25. A VP controller 31 controls the previously mentioned voltage VP applied to the PWELL 6 and the n-type substrate 5 of the solid-state image pickup device 14. In the solid-state image pickup device 14, the vertical and horizontal transfer of charges are controlled by the pulses $\phi V$ and $\phi H$ from a driving circuit 15. An AND gate 17 is responsive to the gate signal from the generating circuit 27 to control the generation of the pulses $\phi V$ from the driving circuit 15 to the MOS solid-state image pickup device 14. A picture signal operating circuit 16 processes the picture signal from the solid-state image pickup device 14 and records it in a memory which is not shown. The timing signals generating circuit 27 is composed of a microprocessor and in response to a release signal, which is in turn generated by a release switch 30 in response to the depression of a shutter button which is not shown, the timing signals generating circuit 27 controls the shutter driver 13, the VP controller 31, the driving circuit 15 and the operating circuit 16. Also, the timing signals generating circuit 27 is operated in accordance with the signals, e.g., vertical synchronizing signal, from a synchronizing signals generator 27. A dynamic range controlling circuit 29 supplies to the timing signals generating circuit 27 the signal required for controlling the VP controller 31 which varies the ratio of the time t1 to the time t2.

Next, FIG. 9 will be explained. The same reference numerals as shown in FIG. 1 designate the counterparts to those shown in FIG. 9. A vertical shift register 18 is connected to a plurality of vertical switches 21 through a given number of vertical gates 2 and it is responsive to the pulses $\phi V$ to successively apply a voltage to the vertical gates 2. When this occurs, the vertical switches 21 connected to the vertical gates 2 are turned on and thus the charges stored in photodetectors 1 are transferred to vertical signal lines 3. A horizontal shift register 19 is connected to the vertical signal lines 3 by way of a plurality of horizontal switches 23 connected between the vertical signal lines 3 and an output amplifier 20 and by way of a plurality of horizontal gates 22. The horizontal shift register 19 is responsive to the pulses $\phi H$ to successively apply a voltage to the horizontal gates 22 and thereby turn on the horizontal switches 23 in turns. Thus, the number of pulses $\phi H$ between the pulses $\phi V$ is equal to the number of horizontal switches 23.

Figure 10:
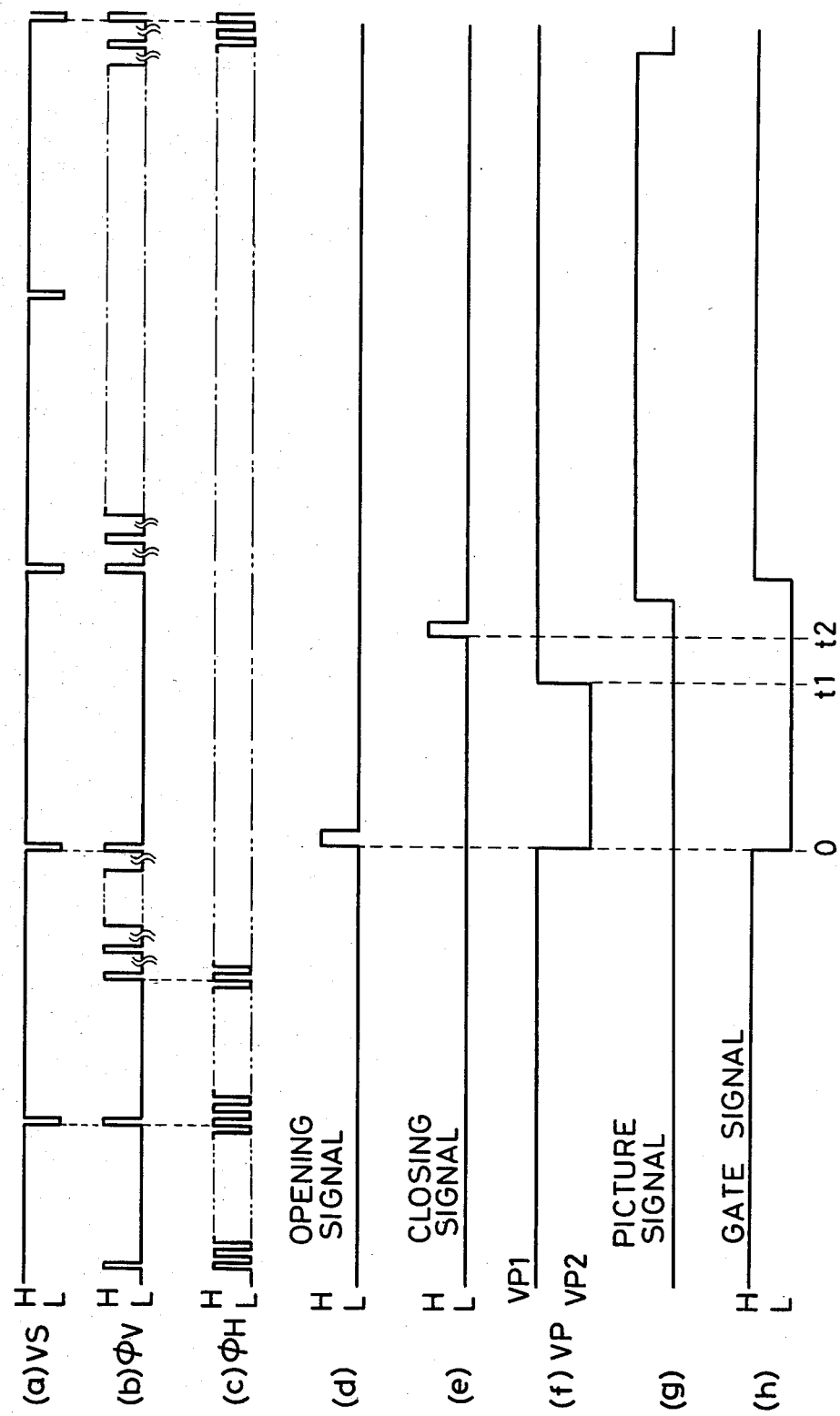
FIG. 10 is a timing chart showing the operation of the electronic still picture camera according to the present invention.

FIG. 10 shows the overall operation of the electronic still picture camera of the invention shown in FIGS. 8 and 9 and the high and low levels of the signals are respectively simply referred to as "H" and "L".

The shutter button is depressed first so that the release switch 30 is turned on and the vertical and horizontal shift register pulses $\phi V$ and $\phi H$ shown in (b) and (c) of FIG. 10 are applied to the MOS solid-state image pickup device 14, thereby draining the extraneous charges with the mechanical shutter 12 in the closed position.

Then, the shutter 12 is opened by the shutter opening signal generated from the timing signals generating circuit 27 as shown in (d) at the timing synchronized with the vertical synchronizing signal VS shown in (a) and the light falls on the photodetectors 1, thus making an exposure. In this case, simultaneously the voltage VP applied to the PWELL 6 is changed from VP1 to VP3 as shown in (f) by the VP controller 31 so that a first condition (the condition of FIG. 4) is attained and the exposure is made with the low potential well. During at least the interval from 0 to t1 the timing signals generating circuit 27 causes the gate signal to go to the L level as shown in (h) so that the AND gate 17 is closed and the application of the pulses $\phi V$ to the vertical shift register 18 is prevented. However, during this interval the charges flow to the vertical signal lines 3 from the photodetectors 1 so that the pulses $\phi H$ are applied to the horizontal shift register 19 and the charges on the signal lines 3 are drained.

After the given time t1, the voltage applied to the PWELL 6 is restored to the initial value VP1 so that a second condition (the condition of FIG. 2) is attained and the potential well becomes high. Then, the shutter 12 is closed by the shutter closing signal shown in (e) at the time t2 of the shutter speed. Then, a picture signal corresponding to one frame is generated as shown in (g) in synchronism with the first vertical synchronizing signal after the completion of the shutter closing operation. In this case, no reading is made while the mechanical shutter is open so that no smear is caused and moreover the use of a lens shutter makes it possible to make an all-picture-elements simultaneous exposure and ensure the same characteristic for all the picture elements with respect to the brightness of the scene.

Then, in the case of the actual electronic still picture camera, even if the shutter speed is changed, the object-brightness dynamic range characteristic should not be allowed to change. Thus, the value of t1/t2 must always be set constant even if the shutter speed t2 is varied.

Figure 11:
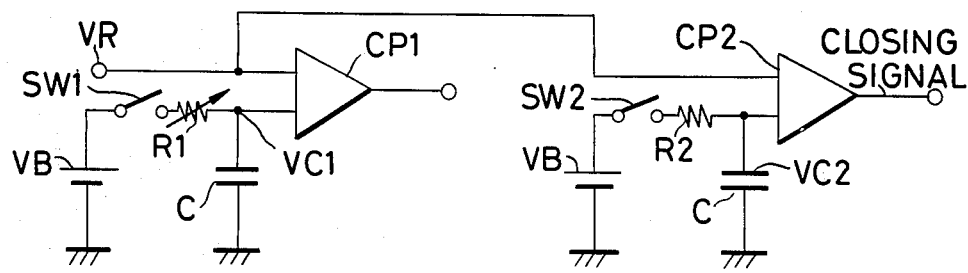
FIG. 11 is a diagram of an electric circuit designed so that the scene-brightness dynamic range characteristic is not varied by a change in the shutter speed.

FIG. 11 is a diagram showing an electric circuit which must be incorporated in the timing signals generating circuit 27 of FIG. 8 for the purpose of accomplishing the foregoing object. In FIG. 11 symbol VR designates a voltage representing a logarithmically compressed light intensity. Voltage VR is generated from the photometric circuit 26 in the photometric system and is applied to one input of comparators CP1 and CP2, respectively. A dc voltage VB is applied to the other input of the comparators CP1 and CP2, respectively, through one integrating circuit including a switch SW1, a resistor R1 and a capacitor C and another integrating circuit including a switch SW2, a resistor R2 and a capacitor C.

Figure 12:
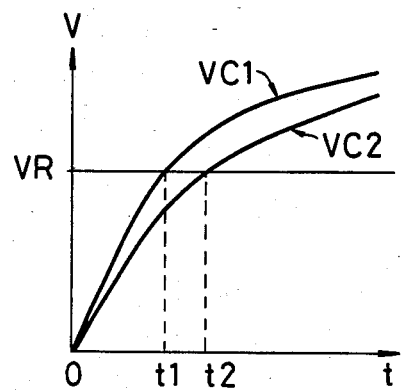
FIG. 12 is a waveform diagram for explaining the operation of the circuit of FIG. 11.

FIG. 12 is a graph showing the variations of voltages VC1 and VC2 on the capacitors C after the closing of the switches SW1 and SW2 in response to the release signal from the release switch 30. The comparator CP1 generates a pulse at the time t1 and the comparator CP2 generates a pulse corresponding to the closing signal at the time t2.

The following equations (1) and (2) show the conditional expressions for the comparators CP1 and CP2, respectively.

$$VP = VB\{1 - \exp(-t1/R1 \cdot C)\} \quad (1)$$

$$VP = VB\{1 - \exp(-t2/R2 \cdot C)\} \quad (2)$$

The relation of the following equation (3) is obtained from the equation (1) and (2)

$$VB\{1 - \exp(-t1/R1 \cdot C)\} = VB\{1 - \exp(1 - \exp(-t2/R2 \cdot C)\} \quad (3)$$

$$\therefore \frac{t1}{t2} = \frac{R1}{R2} = \text{constant (with respect to } VP\text{)}$$

As will be seen from equation (3), the value of t1/t2 can be made constant independently of the light intensity indicative voltage VP. Also, the value of t1/t2 can be varied by varying the value of the resistor R1 or R2. As a result, by virtue of the circuit shown in FIG. 11, it is possible to pick up pictures without varying the characteristic even if the shutter speed is varied.

Figure 13:
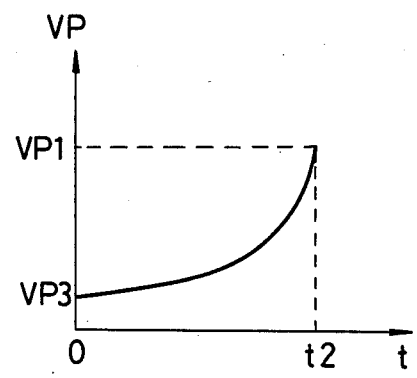
FIG. 13 is a graph showing the relation between the potential VP and the exposure time.

It is to be noted that the voltage applied to the PWELL of the MOS solid-state image pickup device may be a voltage signal which varies curvilinearly with the exposure time as shown in FIG. 13 and in this way it is possible to produce a picture signal compressed logarithmically with respect to the incident light intensity.

Further, while the lens shutter is used in the above-described embodiment, the reason for this is to ensure the start of exposure at the same time and the same exposure time for all the photodetectors of the MOS solid-state image pickup device.

What is claimed is:

1. A camera for focusing an image of a scene to be picked up on a given surface and generating a picture signal corresponding to the image of the scene, said camera comprising:
   (a) a MOS solid-state image pickup device for detecting a distribution of light intensities on said given surface, said solid-state image pickup device including
      a first region of n-type semiconductor extending in a direction along said given surface to generate charges corresponding to the light intensities,
      a second region of p-type semiconductor arranged along said given surface to adjoin said first region,
      a third region of n-type semiconductor arranged along said given surface to adjoin said second region, and
      a fourth region of p-type semiconductor arranged in a direction substantially perpendicular to a direction in which said given surface extends to adjoin said first region,
      said first region having a first level of potential for said charges,
      said second region having a second level of potential higher than said first level,
      said third region having a third level of potential lower than said second level,
      said fourth region having a fourth level of potential higher than said first level and lower than said second level prior to the start of the exposure of said given surface;
   (b) means for controlling an exposure time of said given surface to said image of the scene; and
   (c) means for shifting the potentials of said first and fourth regions in such a manner that the potential level of said first region is maintained lower than the potential level of said fourth region during a time that said given surface is exposed by said control means and the potential of said fourth region becomes higher than said second level in response to the start of the exposure of said given surface.

2. A camera for focusing an image of a scene to be picked up on a given surface and generating a picture signal corresponding to the image of the scene, said camera comprising:
   (a) a MOS solid-state image pickup device for detecting a distribution of light intensities on said given surface, said solid-state image pickup device including
      a first region of n-type semiconductor extending in a direction along said given surface to generate charges corresponding to the light intensities,
      a second region of p-type semiconductor arranged along said given surface to adjoin said first region,
      a third region of n-type semiconductor arranged along said given surface to adjoin said second region,
      a fourth region of p-type semiconductor arranged in a direction substantially perpendicular to a direction in which said given surface extends to adjoin said first region, and
      a fifth region of n-type semiconductor arranged in a direction substantially perpendicular to the direction of extension of said given surface to adjoin said fourth region,
      said first region having a first level of potential for said charges,
      said second region having a second level of potential higher than said first level,
      said third region having a third level of potential lower than said second level,
      said fourth region having a fourth level of potential higher than said first level and lower than said second level prior to the start of the exposure of said given surface,
      said fifth region having a fifth level of potential lower than said fourth level;
   (b) means for controlling an exposure time of said given surface to said image of the scene; and
   (c) means for shifting the potentials of said first and fourth regions in such a manner that the potential level of said first region is maintained lower than the potential level of said fourth region during a time that said given surface is exposed by said control means, said shift means including means for adjusting the potential difference between said fourth and fifth regions in such a manner that the potential level of said fourth region becomes higher than the potential level of said second region.

3. A camera according to claim 2, wherein said adjusting means includes means whereby the potential difference between said fourth and fifth regions in set to a first value prior to the beginning of exposure of said given surface by said exposure means and the potential difference between said fourth and fifth regions is changed to a second value greater than said first value in response to the lapse of a predetermined time period from the beginning of exposure of said given surface by said exposure means.

4. A camera according to claim 3, wherein said adjusting means includes means for maintaining constant the ratio of the exposure time of said given surface to said predetermined time period.

5. A MOS solid-state image pickup device for detecting a distribution of light intensities on a photosensitive surface, side device comprising:
(a) a first region of n-type semiconductor extended in a direction along said photosensitive surface to generate charges corresponding to said light intensities, said first region having a first level of potential;
(b) a second region of p-type semiconductor arranged along said photosensitive surface to adjoin said first region, said second region having a second level of potential higher than said first level;
(c) means for transferring said charges generated by said first region, said means including a third region of n-type semiconductor arranged along said photosensitive surface to adjoin said second region, said third region having a third level of potential lower than said second level;
(d) a fourth region of p-type semiconductor arranged in a direction substantially perpendicular to a direction of extension of said photosensitive surface to adjoin said first region, said fourth region having a fourth level of potential higher than said first level and lower than said second level prior to light detection; and
(e) means for shifting the potential levels of said first and fourth regions in such a manner that the potential level of said first region is maintained lower than the potential level of said fourth region and the potential of said fourth region becomes higher than said second level in response to the start of light detection.

6. A MOS solid-state image pickup device for detecting a distribution of light intensities on a photosensitve surface, said device comprising:
(a) a first region of n-type semiconductor extended in a direction along said photosensitive surface to generate charges corresponding to said light intensities, said first region having a first level of potential;
(b) a second region of p-type semiconductor arranged along said photosensitive surface to adjoin said first region, said second region having a second level of potential higher than said first level;
(c) means for transferring said charges generated by said first region, said means including a third region of n-type semiconductor arranged along said photosensitive surface to adjoin said second region, said third region having a third level of potential lower than said second level;
(d) a fourth region of p-type semiconductor arranged in a direction substantially perpendicular to a direction of extension of said photosensitive surface to adjoin said first region, said fourth region having a fourth level of potential higher than said first level and lower than said second level prior to light detection;
(e) a fifth region of n-type semiconductor arranged in a direction substantially perpendicular to the direction of extension of said photosensitive surface to adjoin said fourth region, said fifth region having a fifth level of potential lower than said fourth level, and
(f) means for shifting the potential levels of said first and fourth regions in such a manner that the potential level of said first region is maintained lower than the potential level of said fourth region, said shift means including means for varying the potential difference between said fourth and fifth regions in such a manner that the potential level of said fourth region becomes higher than the potential level of said second region in response to the start of light detection.

7. A camera for focusing an image of a scene to be picked up on a given surface and generating a picture signal corresponding to the image of the scene, said camera comprising:
(a) a MOS solid-state image pickup device for detecting a distribution of light intensities on said given surface, said solid-state image pickup device including
a first region of n-type semiconductor extending in a direction along said given surface to generate charges corresponding to the light intensities,
a second region of p-type semiconductor arranged along said given surface to adjoin said first region,
a third region of n-type semiconductor arranged along said given surface to adjoin said second region, and
a fourth region of p-type semiconductor arranged in a direction substantially perpendicular to a direction in which said given surface extends to adjoin said first region,
said first region having a first level of potential for said charges,
said second region having a second level of potential higher than said first level,
said third region having a third level of potential lower than said second level,
said fourth region having a fourth level of potential higher than said first level;
(b) means for controlling an exposure time of said given surface to said image of the scene; and
(c) means for shifting the potentials of said first and fourth regions in such a manner that the potential level of said first region is maintained lower than the potential level of said fourth region during a time that said given surface is exposed by said control means, the potential of said fourth level region becoming higher than said second level at the start of the exposure of said given surface and being lower than said second level prior to the exposure of said given surface.

* * * * *